(12) United States Patent
Lowrey et al.

(10) Patent No.: US 8,908,413 B2
(45) Date of Patent: Dec. 9, 2014

(54) PROGRAMMABLE RESISTANCE MEMORY

(75) Inventors: Tyler Lowrey, Rochester Hills, MI (US); Carl Schell, Waterford, MI (US); Wally Czubatyj, Warren, MI (US); Steve Hudgens, Santa Clara, CA (US); Jon Maimon, Manassas, VA (US); Jeff Fournier, Livonia, MI (US); Mike Hennessey, South Lyon, MI (US); Ed Spall, Manassas, VA (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 13/216,675

(22) Filed: Aug. 24, 2011

(65) Prior Publication Data
US 2011/0305075 A1    Dec. 15, 2011

Related U.S. Application Data

(62) Division of application No. 12/321,223, filed on Jan. 20, 2009, now Pat. No. 8,009,455.

(51) Int. Cl.
*G11C 11/00* (2006.01)
*G11C 11/56* (2006.01)
*G11C 13/00* (2006.01)

(52) U.S. Cl.
CPC ............ *G11C 13/0004* (2013.01); *G11C 11/56* (2013.01); *G11C 11/5678* (2013.01); *G11C 13/0035* (2013.01)
USPC .......................................... 365/148; 365/157

(58) Field of Classification Search
USPC ......................................... 365/148, 157, 163
See application file for complete search history.

(56) References Cited

U.S. PATENT DOCUMENTS

| | | | |
|---|---|---|---|
| 2010/0259962 A1* | 10/2010 | Yan et al. | 365/51 |
| 2012/0147660 A1* | 6/2012 | Chevallier et al. | 365/148 |
| 2012/0236627 A1* | 9/2012 | Koh et al. | 365/148 |

* cited by examiner

*Primary Examiner* — Vu Le
(74) *Attorney, Agent, or Firm* — Kevin L. Bray

(57) ABSTRACT

A memory includes a programmable resistance array with high ratio of dynamic range to drift coefficient phase change memory devices.

10 Claims, 12 Drawing Sheets

PROGRAMMABLE RESISTANCE MEMORY

CROSS-REFERENCE TO RELATED APPLICATIONS

This application is a division of U.S. patent application Ser. No. 12/321,223, filed Jan. 20, 2009, now U.S. Pat. No. 8,009,455 the disclosure of which is incorporated by reference herein.

FIELD OF INVENTION

This invention relates to electronic memory devices.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are programmable resistance technologies, such as phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In some chalcogenide materials, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent that the crystalline state.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. A chalcogenide memory device's range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225, for example) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance of the material. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovano et al.; and "Morphing Memory," published in Science News, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as N2 or O2: forming a chalcogenide nitride, or oxide, for example and chalcogenide may be modified by an ion implantation or other process. Materials may also be deposited using chemical vapor deposition (CVD) processes, for example.

Significant research and development efforts have been expended in an attempt to bring programmable resistance memories to full-scale production including multi-level cell embodiments. One impediment to wide-spread adoption of the multi-level cell technology is the tendency the devices' resistance to increase over time. That is, the resistance of a programmable resistance memory (a phase change memory in particular) programmed to a nominal resistance level may increase over time. That resistance increase may, over time, render the programmed state of the device ambiguous. In multi-level cell embodiments, where an individual memory element is programmed to one of three or more resistance values, this phenomenon, generally referred to as, resistance drift, or, simply, drift, is particularly troublesome and a number of drift-compensation techniques have been proposed. Resistance drift can generally be described in terms of a power law function where the resistance changes as a function of time to a certain power d, and a shorthand measure of the resistance drift's magnitude is the power law factor, d. $R=R_0(t/t_0)^d$ where $R_0$ is the resistance at a time $t_0$ after programming and d is the drift power coefficient. The coefficient d will be referred to herein as the resistance drift coefficient or, simply, as the drift coefficient.

Although already efficient and cost effective; manufacturing and operational processes, and device structures, that further reduce the cost of programmable resistance memories, and, in particular, that address the problem of resistance drift would be highly desirable.

SUMMARY OF THE INVENTION

A programmable resistance memory in accordance with the principles of the present invention may employ memory elements that exhibit a ratio of dynamic-range to drift-coefficient that is sufficient to permit operation of the memory for a predetermined period of time, without employing drift-compensation techniques. The ratio of dynamic-range to drift-coefficient may also be referred to herein as the "dynamic/drift" ratio. In an illustrative embodiment, such a memory employs phase change material providing devices having a resistance dynamic range of at least three orders of magnitude and a drift coefficient that permits operation for from 10 seconds to fifty years without employing drift compensation techniques. Such a memory may be a phase change memory that employs an Indium/Selenium/Tellurium alloy as the phase change material. In other embodiments, high dynamic range/drift coefficient ratio memories may employ doped Germanium/Selenium/Tellurium alloys that may be doped with Arsenic or Selenium, for example.

In accordance with the principles of the present invention a high dynamic range alloy may be employed as a memory's programmable resistance material. By employing high dynamic range programmable resistance materials, a memory in accordance with the principles of the present invention may increase the memory's dynamic/drift ratio. In particular, recognizing that, although the composition of a phase change alloy may be a significant factor in the determination of a memory element's drift characteristics, the composition also plays a significant role in determining the resistance dynamic range in programmable resistance devices. In such an embodiment, even with compositions providing no improvement in the memory's resistance drift, because the phase change material exhibits a higher dynamic range, the overall drift-contribution to MLC resistance level change with time is diminished by comparison.

In accordance with the principles of the present invention, storage levels may be assigned within a device's resistance range in a manner that accommodates variations across an array of devices. Such variations may be due to varying sensitivity to programming currents among the devices, inconsistencies of current programming sources, structural differences among various memory elements, or compositional variations among the devices, for example. Additionally, in an illustrative embodiment, drift at a plurality of storage levels may be factored in to the assignment of resistance values to storage levels in a manner that maximizes storage level separation.

A programmable resistance memory in accordance with the principles of the present invention may divide its dynamic range into sub-ranges, some of which are more suitable for programming than others. The sub-ranges suited for programming may be referred to herein as "programmable ranges." Memories in accordance with the principles of the present invention need not exhibit a single, contiguous, programmable range. Additionally, in accordance with the principles of the present invention, a memory's programmable range may be sub-divided in a variety of ways. For example, a programmable range may be divided substantially linearly, with storage levels evenly distributed throughout the range (e.g., 10 kΩ, 3.3 MΩ, and 9.9 MΩ nominal values for a 10 MΩ programming range). Or, a programmable range may be divided in a substantially exponential manner, with storage levels assigned as a multiple of some exponent (e.g., 10 kΩ, 100 kΩ, 1 MΩ, 10 MΩ nominal values for the same 10 MΩ programming range, using a separation based on an exponent of 10). Whether employing a substantially linear, substantially exponential, or other distribution scheme, a programmable resistance memory in accordance with the principles of the present invention may have storage levels distributed regularly (as in the above example cases) or irregularly.

In accordance with the principles of the present invention, a memory may employ a plurality of current sources; each assigned a different range, to read a programmable resistance memory. In particular, a memory that exhibits a high dynamic range may employ current sources that provide good regulation over assigned sub-ranges centered on a current appropriate for reading a nominal resistance associated with a given storage level. For example, a memory that features a dynamic range of five orders of magnitude, with nominal storage levels assigned to 10 kΩ, 100 kΩ, 1 MΩ, 10 MΩ, and 100 MΩ, may employ current sources configured to provide their best regulation at corresponding current levels of 50 µA, 5 µA, 500 nA, 50 nA, and 5 nA, to provide a 0.5V read signal level. Such a signal level is readily detectable and, at the same time, is low enough to avoid thresholding the device being read (assuming the device's threshold voltage is greater than 0.5V) and possibly disturbing (that is, inadvertently reprogramming) the bit.

In accordance with the principles of the present invention, read currents may be applied in an increasing sequence in order to avoid disturbing a memory element that is being read.

For example, in a phase-change memory embodiment in accordance with the principles of the present invention, the state of the memory may be read by application of a current that does not raise the voltage across the memory as high as the memory's threshold voltage. With a threshold voltage of 0.6V and a programmed resistance of 100 MΩ, the application of current greater than or equal to 6 nA would threshold and, potentially, over-write the memory. Accordingly, read currents are applied to a memory element in a sequence from lowest to highest current, sensing the programmed state along the way, and terminating the sequence once a programmed state has been detected.

A programmable resistance memory exhibiting a high ratio of dynamic-range to drift-coefficient in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Figure 1:
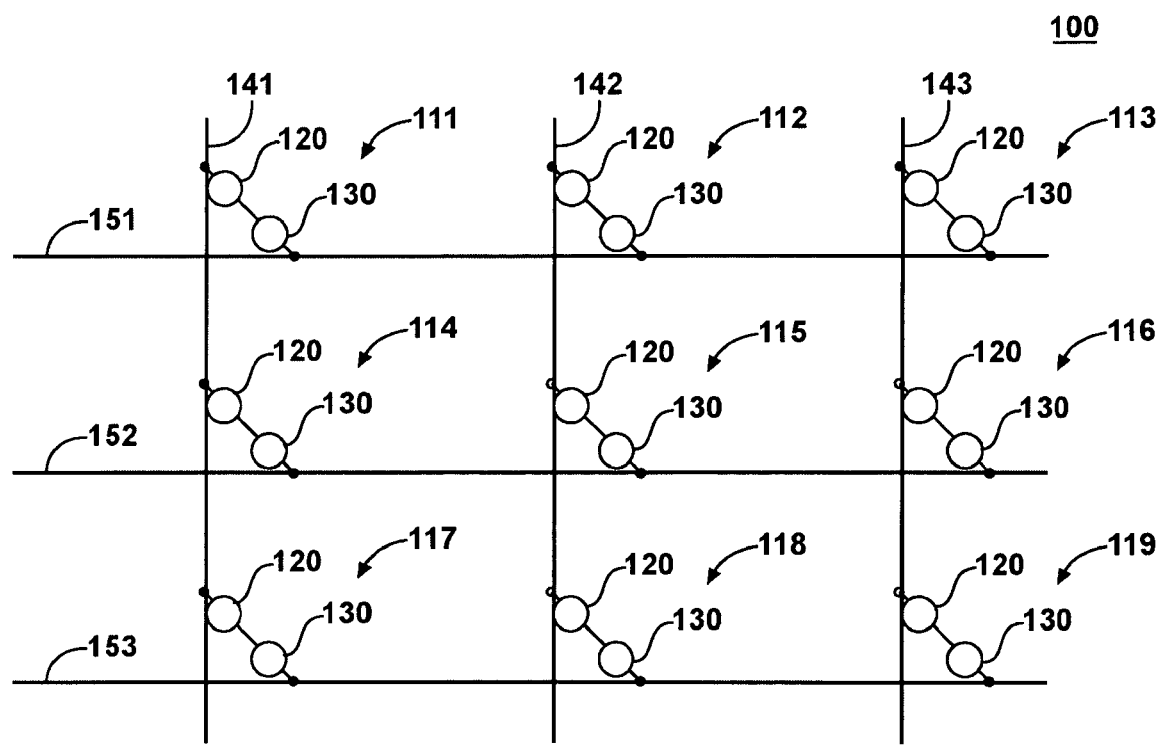
FIG. 1 is a block diagram of an array of memory cells, each including an isolation device and a programmable resistance memory element, in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Process descriptions may include flowcharts that illustrate various steps taken in a process. Such flowcharts and accompanying discussion are not meant to be an exhaustive explanation of every step and every procedure in such a process. Rather, they are meant to provide a description with sufficient detail to enable one of ordinary skill in the art to practice and use the invention. In some embodiments, additional steps may be employed or steps may be carried out in a different sequence than set forth in the flowchart and associated discussion. Accordingly, the scope of the invention is defined only by reference to the appended claims.

A programmable resistance memory in accordance with the principles of the present invention may employ a phase change material that exhibits a broad range of resistance values in comparison to the degree to which the resistance of the material drifts over time. This metric will also be referred to herein as the ratio of the material's dynamic range to its drift coefficient(s), or simply, as the "dynamic/drift ratio." In particular, a programmable resistance memory in accordance with the principles present invention may employ memory elements that exhibit a dynamic/drift ratio that is sufficient to permit operation of the memory for a predetermined period of time without any of their storage levels being rendered ambiguous by resistance drift. Such memories may, in addition to employing high dynamic/drift materials, employ drift compensation techniques to further extend the devices' data retention period. In an illustrative embodiment, such a memory may employ phase change material having a dynamic range of at least three orders of magnitude and a drift coefficient that permits room memory operation for at least 10 years without employing drift compensation techniques. Such a memory may be a phase change memory that employs an indium/selenium/tellurium alloy as the phase change material. In other embodiments, high dynamic/drift memories may employ germanium/antimony/tellurium alloys that may be doped with arsenic or selenium, for example.

In an illustrative embodiment, a memory may increase the ratio of its dynamic/drift ratio simply by increasing the dynamic range of the phase change material it employs. That is, recognizing that many factors may contribute to the drift coefficient of a memory, including the composition and structure of the memory cell's electrodes, for example, employing a phase change material with increased dynamic range, while keeping other factors equal, increases the dynamic/drift ratio.

Storage levels may be assigned within a device's resistance range in a manner that accommodates variations across an array of devices. Such variations may be due to varying sensitivity to programming currents among the devices, to inconsistencies of current programming sources, to structural differences among various memory elements, or to compositional variations among the devices, for example. As a result of these variations, a memory device's storage levels may encompass bands of resistance. The bands are, effectively, resistance probability distributions. The width of such resistance distributions may be improved, that is, the bands may be narrowed, using programming techniques, some of which are discussed below, that may be employed by a memory in accordance with the principles of the present invention. In addition to accommodating the vagaries of programming memory elements to specific resistance values and minimizing the breadth of the resulting resistance probability distributions (and thereby increasing the margin between program states), a memory in accordance with the principles of the present invention may assign nominal storage levels in a manner that ensures storage-level integrity over a prescribed period of time, such as 10 years.

In an illustrative embodiment, one or more regions of a programmable resistance memory's resistance-space may be deemed less suitable for programming than other regions. Those regions that are more suitable for programming may be referred to herein as "programmable ranges" or "programmable sub-ranges." Memories in accordance with the principles of the present invention may or may not have a single, contiguous, programmable range that is co-extensive with the memory's dynamic range. Additionally, in accordance with the principles of the present invention, a memory's programmable range may be sub-divided in a variety of ways. For example, a programmable range may be divided substantially linearly, with storage levels evenly distributed throughout the range (e.g., 10 kΩ, 3.3 MΩ, and 9.9 MΩ nominal values for a 10 MΩ programming range). Or, a programmable range may be divided in a substantially exponential manner, with storage levels assigned as a multiple of an exponent (e.g., 10 kΩ, 100 kΩ, 1 MΩ, 10 MΩ nominal values for the same 10 MΩ programming range, using a separation based on an exponent of 10). Because memories programmed to different resistance levels may experience different degrees of drift at different resistances, program levels may be unevenly distributed throughout a programmable range in order to accommodate differences in drift.

In illustrative embodiments, a memory may employ a plurality of current sources; each assigned a different range, to read a programmable resistance memory. In particular, a memory that exhibits a high dynamic range may employ current sources that provide good regulation over different sub-ranges associated with different storage levels. For example, a memory that features a threshold voltage of 0.6V and a dynamic range of five orders of magnitude, with nominal storage levels assigned to 10 kΩ, 100 kΩ, 1 MΩ, 10 MΩ, and 100 MΩ, may employ current sources configured to provide their best regulation at corresponding current levels of 50 µA, 5 µA, 500 nA, 50 nA, and 5 nA, to provide a sufficient read signal level while avoiding thresholding the device. In an illustrative embodiment, a read operation may be performed by applying read currents in a sequence of increasing amplitude (for example, 5 nA, 50 nA, 500 na, etc) until the storage state of the memory is determined. By applying read currents in such a sequenced manner, a memory in accordance with the principles of the present invention avoids the thresholding of an accessed memory cell during a read operation. That is, the state of a memory cell may be read by application of a current that does not raise the voltage across the memory as high as the memory's threshold voltage. With a threshold voltage of 0.6V and a programmed resistance of 100 MΩ, the application of current greater than or equal to 6 nA would threshold and, potentially, over-write the memory. Accordingly, read currents may be applied to a memory element in a sequence from lowest to highest current, sensing the programmed state along the way and terminating the sequence once a programmed state has been detected. Although a single current source may be employed to span the orders-of-magnitude range required to properly detect the state of a memory cell, increasing the current and sensing along the way, employing a plurality of current sources allows for tighter read voltage regulation over the entire read-current range.

In the illustrative embodiment of FIG. 1, a memory array 100 in accordance with the principles of the present invention includes memory cells 111-119 arranged in a cross-point array. Each cell includes a memory element 130 and an isolation device 120. For convenience and clarity of illustration, only nine cells are shown, but billions may be included in an individual device. As will be described in greater detail in the discussion related to subsequent Figures, the memory element 130 may be implemented as a programmable resistance element that exhibits a high dynamic/drift ratio. Such elements may employ a phase change material such as indium/antimony/tellurium (IST), arsenic-doped germanium/antimony/tellurium (GST), or selenium-doped GST, for example. The isolation device 120 may be implemented as a transistor, diode, or as an Ovonic Threshold Switch (OTS), for example.

The memory array 100 includes column lines 141-143 and row lines 151-153, which are used to select a particular memory cell within the array during an access operation. An access operation may be a READ operation, or a WRITE operation, for example. In a binary memory configuration, each cell may be written to a "1" or a "0." In a multi-level configuration, each cell may be written to any of three or more memory states. Row lines 151-153 and column lines 141-143 may also be referred to herein, respectively, as word address and column address lines, respectively.

With memory elements 130 connected to word address lines and coupled through isolation devices 120 to bit address lines 141-143, a specific memory cell is accessed by assertion of the appropriate word and bit address lines. Asserting word address line 152 and bit address line 142, for example, selects memory cell 115 for access (that is, for a READ or WRITE operation).

In operation, the isolation device 120 may act as a switch that is either "off" or "on" depending on the voltage applied across the memory cell 111-119. The off state may be a substantially electrically nonconductive state and the on state may be a substantially electrically conductive state. The isolation device 120 may exhibit a threshold voltage beyond which the device becomes highly electrically conductive. With an applied potential less than the threshold voltage, the device is, effectively an open circuit, which thereby isolates the associated memory element 130. Such isolation is used to ensure that inadvertent accesses are not executed upon or through memory elements that are programmed to a low-resistance state and that are "partially-accessed." By "partially-accessed," we mean a memory element that shares a row or column access line with a memory element that is being accessed. With an applied voltage greater than the threshold voltage, the device 120 is, effectively, a short circuit, which thereby allows access to the associated memory element 130. With the isolation device 120 "thresholded," a portion of the voltage applied across the memory cell 115 will fall across the isolation device 120. The remainder of the applied voltage will fall across the memory element 130 and, when properly biased, that portion of the applied voltage will be sufficient to perform an access operation (e.g., READ or WRITE). The isolation device 120 may also be referred to as an access device, a select device, or a switch, for example.

Figure 2:
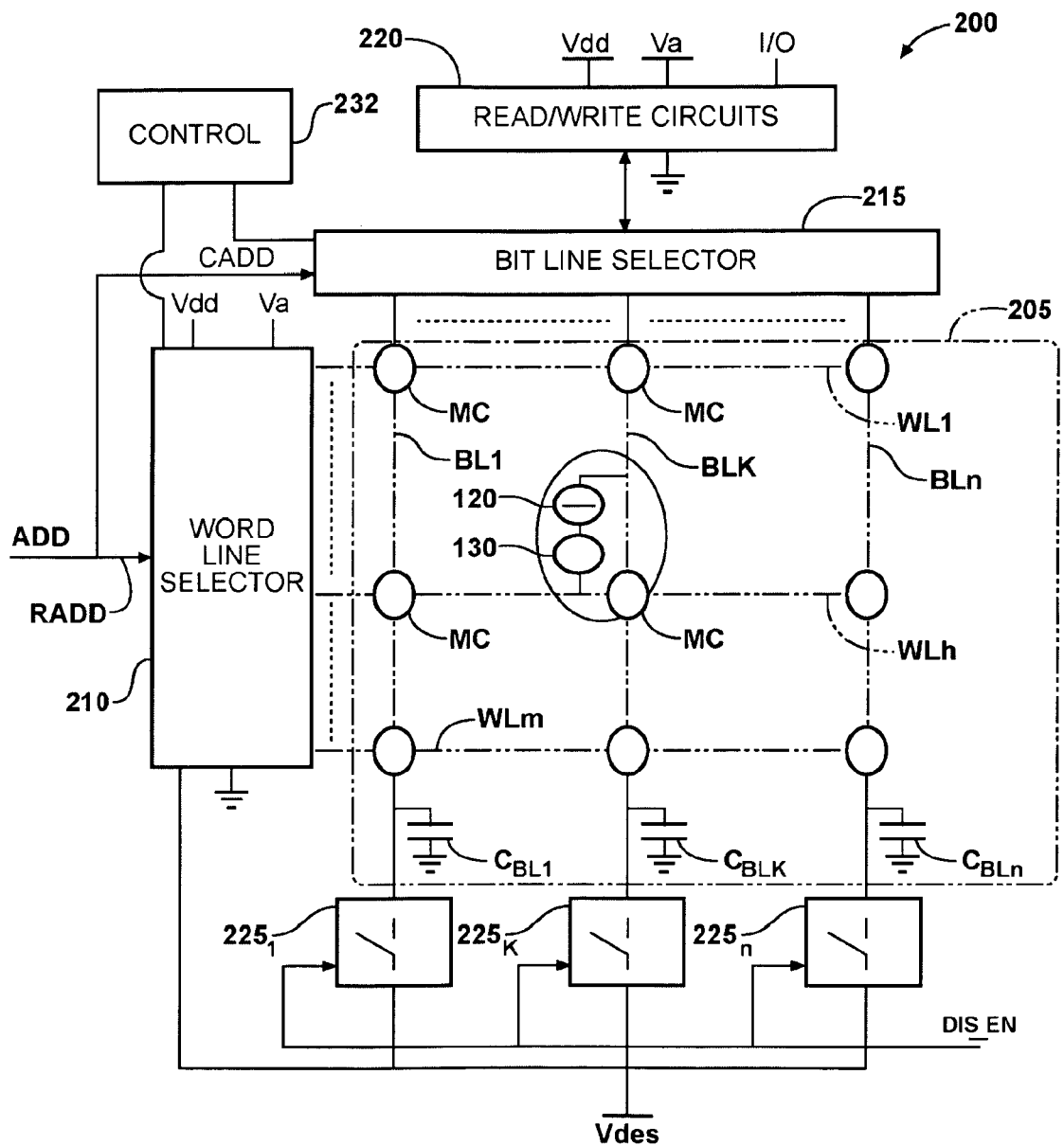
FIG. 2 is a block diagram of a memory array, including peripheral circuitry, in accordance with the principles of the present invention.

The block diagram of FIG. 2 illustrates a crosspoint array of memory cells such as those of FIG. 1, along with associated access circuitry. In this illustrative embodiment, the memory cells are labeled MC, the row/word lines are labeled WLn, and the column/bit lines are labeled BLn. As previously noted, the terms, "rows," "word lines," "bit lines," and "columns" are merely meant to be illustrative and are not limiting with respect to the type and style of the sensed array. The memory 200 includes a plurality of memory cells MC arranged in an array 205. The memory cells MC in the matrix 205 may be arranged in m rows and n columns with a word line WL1-WLm associated with each matrix row, and a bit line BL1-BLn associated with each matrix column.

The memory 200 may also include a number of auxiliary lines, including a supply voltage line Vdd and a ground (also referred to as reference) voltage line, respectively distributing a supply voltage Vdd and return throughout the memory 200. Depending on configurations and materials, the supply voltage Vdd may be, for example, in a range from 1V to 3V: 1.8V, for example. A high voltage supply line Va may provide a relatively high voltage, generated by devices (e.g. charge-pump voltage boosters not shown in the drawing) integrated on the same chip (that is, included on the same standalone device), or externally supplied to the memory device 200. For example, the high voltage Va may be 4.5-5 V and such a voltage may be employed, for example to provide a relatively high current to a selected memory cell.

Each memory cell MC includes a memory element 130 that employs a programmable resistance memory material, such as phase change memory material, and an isolation device 120, as described in the discussion related to FIG. 1. Each memory cell MC in the matrix 205 is connected to a respective one of the word lines WL1-WLm and a respective one of the bit lines BL1-BLn. In particular, the storage element 130 may have a first terminal connected to the respective word line WL1-WLn and a second terminal connected to a first terminal of the associated access device 120. The access device 120 may have a second terminal connected to a bit line BL1-BLm. Alternatively, the storage element 130 may be connected to the respective bit line BL1-BLm and the access device 120, associated with the storage element 130, may be connected to the respective word line WL1-WLn.

A memory cell MC within the matrix 205 is accessed by selecting the corresponding row and column pair, i.e. by selecting the corresponding word line and bit line pair. Word line selector circuits 210 and bit line selector circuits 215 may perform the selection of the word lines and of the bit lines on the basis of a row address binary code RADD and a column address binary code CADD, respectively, part of a memory address binary code ADD, for example received by the memory device 200 from a device external to the memory (e.g., a microprocessor). The word line selector circuits 210 may decode the row address code RADD and select a corresponding one of the word lines WL1-WLm, identified by the specific row address code RADD received. The bit line selector circuits 215 may decode the column address code CADD and select a corresponding bit line or, more generally, a corresponding set of bit lines of the bit lines BL1-BLn. The set may correspond, for example, to selected bit lines that can be read during a burst reading operation on the memory device 200. A bit line BL1-BLn may be identified by the received specific column address code CADD.

The bit line selector circuits 215 interface with read/write circuits 220. The read/write circuits 220 enable the writing of desired logic values into the selected memory cells MC, and reading of the logic values currently stored therein. The read/write circuits 220 may include sense amplifiers, comparators, reference current/voltage generators, and current a/o voltage pulse generators for reading the logic values stored in the memory cells MC and current a/o voltage pulse generators for writing to the memory cells MC. The read/write circuits 220 are described in greater detail in the discussion related to FIG. 3.

In an illustrative embodiment, when the memory device 200 is not being accessed (between reads and writes or during a standby period, for example), the word line selection circuits 210 may keep the word lines WL1-WLm at a relatively high de-selection voltage Vdes (for example, a voltage roughly equal to half the high voltage Va (Va/2)). At the same time, the bit line selection circuits 215 may keep the bit lines BL1-BLn disconnected, and thus isolated, from the read/write circuits 220 or, alternatively, at the de-selection voltage Vdes. In this way, inadvertent accesses of the memory cells is prevented, since the bit lines BL1-BLn are floating or at a voltage close to that of the deselected word lines and, consequently, approximately zero voltage is dropped across the access elements 120. Additionally, spare (redundant) rows and columns may be provided and used with a selection means to replace defective rows, bits, and columns by techniques familiar to those skilled in the art.

Access methods such as may be employed by a programmable resistance memory in accordance with the principles of the present invention are described in greater detail in the discussion related to the following Figures. Such access methods may be used in combination with other, known, access methods disclosed, for example, in: U.S. Pat. No. 7,154,774 to Bedeschi et al, U.S. Pat. No. 7,280,390, to Kostylev et al, published U.S. patent application 2006/0056251 to Parkinson, published U.S. patent application 2006/0227590 to Parkinson, published U.S. patent application 2006/0279979 to Lowrey et al, and published U.S patent application 2006/0227592 to Parkinson et al, which are hereby incorporated by reference.

During an access operation, the word line selection circuits 210 may lower the voltage of the selected one of the word lines WL1-WLm to a word line selection voltage $V_{WL}$ (for example, having a value equal to 0V, ground potential, and the remaining word lines may be kept at the word line de-selection voltage Vdes. Similarly, the bit line selection circuits 215 may couple a selected one of the bit lines BL1-BLn (more typically, a selected bit line set) to the read/write circuits 220, while the remaining, non-selected bit lines may be left floating or held at the de-selection voltage, Vdes. When the memory device 200 is accessed, the read/write circuits 220 force a suitable current a/o voltage pulse into each selected bit line BL1-BLn. The pulse amplitude, duration, and waveshape, including trailing edge rate, may depend, for example, on the operation to be performed and will be described in greater detail in the discussion related to the following Figures.

In order to avoid spurious reading of the memory cells MC, the bit line stray capacitances $C_{BL1}$-$C_{BLn}$ may be discharged before performing a read operation. To that end, bit line discharge circuits $225_{1-n}$ may be enabled in a bit line discharge phase of the memory device operation that may take place before or after an access operation, for example. The bit line discharge circuits $225_{1-n}$ may employ N-channel MOSFETs, for example, each having a drain terminal connected to the corresponding bit line BL1-BLn, a source terminal connected to a de-selection voltage supply line Vdes providing the de-selection voltage Vdes and a gate terminal controlled by a discharge enable signal DIS_EN.

In an illustrative embodiment, before starting an access operation, the discharge enable signal DIS_EN may be temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ and thereby drive the bit lines to the de-selection voltage Vdes. Subsequently, before selecting the desired word line WL1-WLm, the discharge enable signal DIS_EN is de-asserted and the discharge MOSFETs turned off. Similarly, the selected row and column lines may be respectively precharged to an appropriate safe starting voltage for selection and read or write operation.

Figure 3:
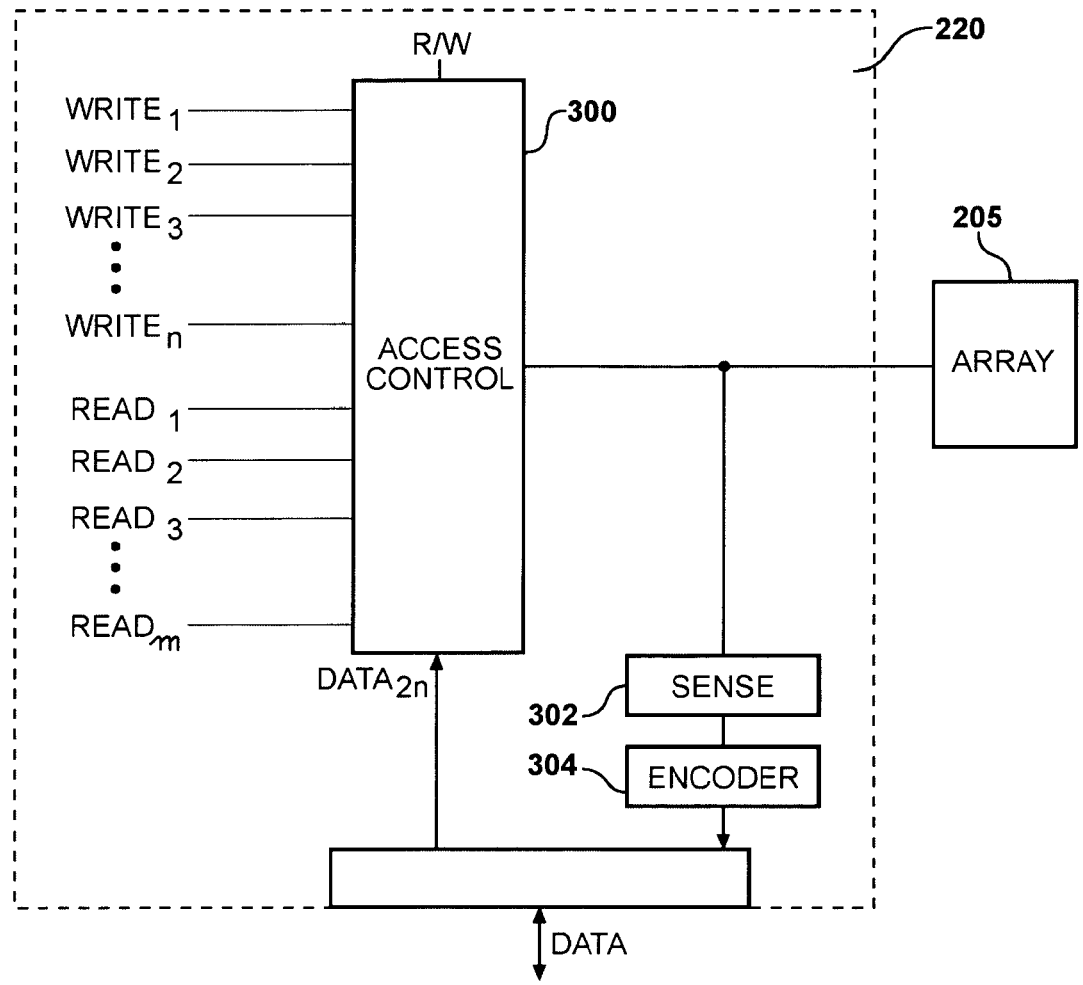
FIG. 3 is a block diagram of access circuitry of a memory array in accordance with the principles of the present invention.

The conceptual block diagram of FIG. 3 provides a more detailed view of the read/write circuit 220 of FIG. 2. Input DATA, READ, and WRITE signals are received by, and output DATA is transmitted from, the read/write circuit 220. The read/write circuitry 220 is configured to write data to and read data from the memory array 205. The memory array 205 may be organized, for example, as a hierarchical memory, with the memory cells arranged in blocks, each with associated connection to access circuitry such as read/write circuit 220. Hierarchical phase change memory arrays are known and discussed, for example, in U.S. Pat. No. 6,813,177 issued to Lowrey et al, which is hereby incorporated by reference. The read/write circuitry 220 includes circuitry that determines, in response to input from circuitry accessing the memory, what operation (i.e. READ, WRITE 000, WRITE 001, WRITE 010, etc.) will be performed upon what cell(s) within the memory array 205 and, if a multi-level WRITE operation is to be performed, the storage level to be written into the selected phase change cell. In embedded memory applications within the scope of the invention, the memory array 104 and access circuitry 102 may be formed on the same die as, and adjacent to, other circuitry, such as a microprocessor, for example.

In this illustrative embodiment a plurality of WRITE current pulse sources, $WRITE_1$, $WRITE_2$, $WRITE_3$ ... $WRITE_n$, and a plurality of READ current pulse sources, $READ_1$, $READ_2$, $READ_3$ ... $READ_n$, are coupled to a memory access controller 300. The controller 300 routes current from one of the pulse sources to an accessed memory cell within the array 205, the particular current source determined by the operation to be performed. If, for example, programming a cell to binary 000 is defined as a $WRITE_1$ operation, the memory access controller 300 routes current from the source $WRITE_1$ to a selected memory cell within the array 205 whenever it receives a write command from the R/W signal line and a binary value of 000 on the input data lines. Similarly, if programming a cell to binary 001 is defined as a $WRITE_2$ operation, the memory access controller 300 routes current from the source $WRITE_2$ to a selected memory cell within the array 205 whenever it receives a write command from the R/W signal line and a binary value of 001 on the input data lines. The controller 300 may be implemented in digital or analog circuitry or a combination thereof. The controller function may be incorporated in a controller circuit that provides other memory functionality, such as a built in self test function, for example.

As will be described in greater detail in the discussion related to the following Figures, a read operation may employ an ordered sequence of increasing-amplitude read current-pulses to read the storage state of a selected memory cell. Read current pulses are generally configured to avoid thresholding a memory that is being read and, thereby, avoid inadvertent programming of the memory (disturb). In some embodiments in accordance with the principles of the present invention, particularly those employing high-dynamic-range phase change materials and multi-level storage, the read current required to generate a measureable signal across a memory cell that is programmed to a low resistance state would threshold the same memory cell if it were applied to the memory cell when programmed to a high resistance state. To accommodate such eventualities, the memory access controller 300 applies a read current of increasing amplitude until the programmed state of the selected memory is sensed. The controller 300 then cuts off the current source before the read current can reach a level that establishes a threshold voltage across a selected memory element. Although a single read current source may be used to apply a current pulse of steadily-increasing amplitude, in accordance with the principles of the present invention a sequence of read current pulses, each pulse having greater amplitude than the preceding pulse, may be applied until the programmed state of the memory is sensed.

The use of multiple read current sources is of particular merit in a high-dynamic-range embodiment in which the programmed resistance levels may vary over three or more orders of magnitude and, correspondingly, the read current pulse amplitudes do the same. In an illustrative embodiment, the read operation, then, is signaled by the R/W control signal input and, as the memory access controller 300 steps through a sequence of read current pulses, a sense circuit 302 senses the voltage generated by the read current pulse. When a detectable signal is obtained, the read current pulse sequence is terminated and an encoder 304 encodes the sensed value into data in a format suitable to be output on the data lines DATA. The encoder 304 may be implemented, for example, as a counter that counts the number of read pulses applied to the selected memory cell before a signal is sensed by the sense circuit 302. In such an embodiment, the encoder may convert the read pulse current count, corresponding to the number of pulses of increasing amplitude that were applied to a selected cell, to a data format such as binary, binary-coded-decimal, or other data format, and then apply the encoded data to data lines DATA.

Figure 4A:
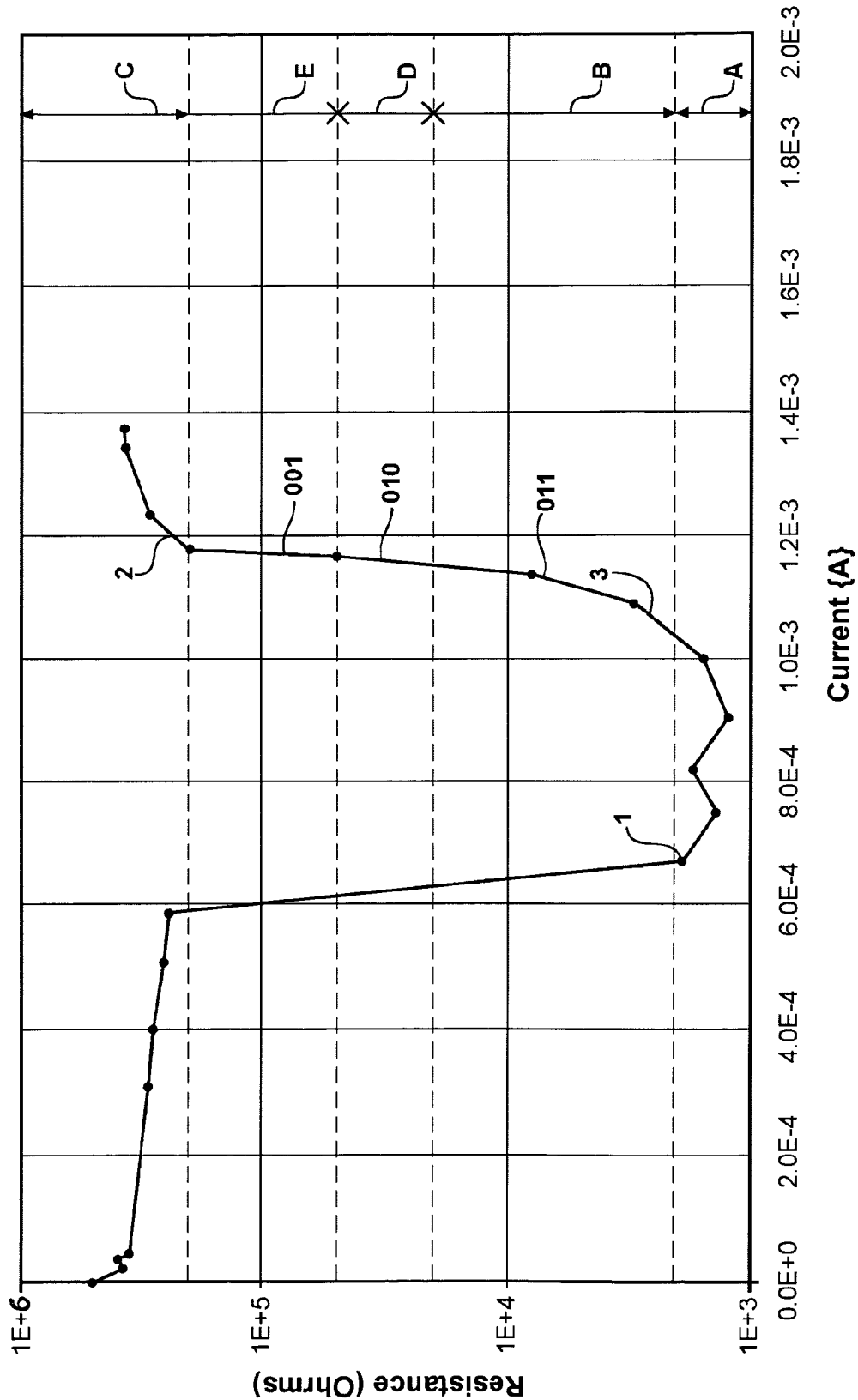
FIG. 4A is a current/resistance plot of a memory in accordance with the principles of the present invention.

FIG. 4A is a plot of resistance versus programming current for a phase change memory cell. This representation is used for illustrative purposes only; the resistance and current values are only included to provide an illustration of general response trends and to clarify the use of terminology employed in the discussion related to this and other Figures discussed herein. In this illustrative embodiment a phase change memory cells is initially programmed to the RESET state as indicated by the high resistance the cell exhibits (approximately 7 MΩ) at the leftmost portion of the graph. In a three-bit, five-level, implementation, this will also be referred to as the "000" level herein. As is known in the art, a three-bit memory scheme may be used to represent up to eight storage levels. For clarity and convenience of illustration, we employ a five-level storage scheme for this illustrative embodiment. Applying a programming pulse having an amplitude of less than 600 μA to the cell has little effect on the resistance and, consequently, no effect on the programmed state of the memory cell. Applying a programming pulse of slightly greater amplitude, of approximately 650 μA in this illustrative embodiment, dramatically alters the resistance of the memory cell, dropping the resistance to approximately 3 kΩ (point 1 on the graph). This low-resistance state may be referred to as the SET state and corresponds to a memory cell with an active volume of phase change material in the crystalline state. In a three-bit, five-level implementation, this will also be referred to as the "100" level herein.

As indicated by the substantially unchanged resistance in the span between 650 μA and 1 mA, programming pulses of less than 1 mA have little effect on the resistance of a SET memory. Below 1 mA, the peak current is not great enough to melt and amorphize an active volume of the memory's phase change material. As the magnitude of the programming pulses increase beyond 1 mA, the resistance of the memory element abruptly increases until, at a programming-pulse amplitude of approximately 1.2 mA, the resistance of the memory element once again approaches that of the RESET state (point 2), with more gradual increases in resistance associated with higher amplitude programming pulses beyond that point.

Beyond these qualitative descriptions, we can define the SET state (the "100" state) of a memory element, represented by band A in FIG. 3, as a state in which the memory element exhibits a resistance that is within 100% of the minimum resistance of a memory element of a specific type at a given environmental setting (e.g., drift-free at 20° C.). Additionally, we define the beginning of a transition from a SET state to a RESET state, represented by point 3 in FIG. 3, as the point at which the resistance of a memory element increases by 100% over the mid-band SET value in response to the application of a programming pulse.

Similarly, we can define the RESET state (the "000" state) of a memory element, represented by band C in FIG. 3, as a state in which the memory element exhibits a resistance that is no less than 30% of the maximum resistance exhibited by a memory element of a specific type at a given environmental setting. Intermediate programming states, a 001 state, a 010 state, and a 011 state, may be assigned to intermediate resistance levels according to a method described in greater detail in the discussion related to the Figures. As is known in the art, programming to these intermediates states may be achieved by "left side" or "right side" programming approaches wherein a RESET cell is programmed to a lower resistance— left side of bath tub curve shown in FIG. 4A (left side programming—between 600 μA and 700 μA in the example in FIG. 4A) or a cell is programmed to a resistance along the right side of the bath tub curve shown in FIG. 4A (right side programming—between 1.0 mA and 1.2 mA in the example of FIG. 4A). As described in the discussion related to FIG. 3, an encoder 304 may be employed to encode resistance levels sensed by sense circuitry 302 into any of a variety of data formats. For example, the encoder 304 may assign binary values to the programmed state of individual memory elements, mapping the five possible storage states into one of five three-bit binary representations. Alternatively, the encoder 304 may assign binary values to groupings of memory elements, with two five-level elements grouped to map their twenty-five possible storage states into the sixteen states represented by four binary digits, or group four five-level elements to map their six-hundred and twenty-five possible storage states into the five-hundred and twelve states represented by nine binary digits, for example.

Intermediate storage states for a cell exhibiting the characteristics of FIG. 4A may be assigned as shown, with a nominal resistance of 7 kΩ for the 011 state, 40 kΩ for the 010 state, and 60 kΩ for the 001 state. In operation, the variability of cell responses leads to the practice of assigning resistance bands to each storage state, with the resistance bands surrounding the stated nominal values. Logic states 001 and 011 depicted in this illustrative example may be respectively assigned resistance ranges of 50 kΩ-100 kΩ and 3 kΩ-15 kΩ, for example.

As will be described in the discussion related to FIG. 4B, a 100% probability distribution of resistances may be used to establish resistance bands corresponding to the various program levels employed by a memory in accordance with the principles of the present invention. The 100% probability distribution of resistances is related to resistance values to which a memory may be programmed with accuracy. Because various factors, including resistance drift, may cause the resistances of memories to wander outside that 100% distribution, resistance bands (also referred to herein as ranges) are assigned in a manner that separates the resistance distributions in accordance with the principles of the present invention. Such "resistance margin" is necessary to prevent the programmed states of a memory from becoming ambiguous. That is, not only do different memory cells respond differently to the same programming pulse (yielding resistance probability distributions that are circumscribed by the bounds of the resistance bands assigned to a memory's logic levels), but also cells' resistance values tend to "drift" upwards over time. As a result, the resistance of a cell programmed to one nominal state could drift upwards over time and become indistinguishable from a cell programmed to a higher-resistance state.

Figure 4B:
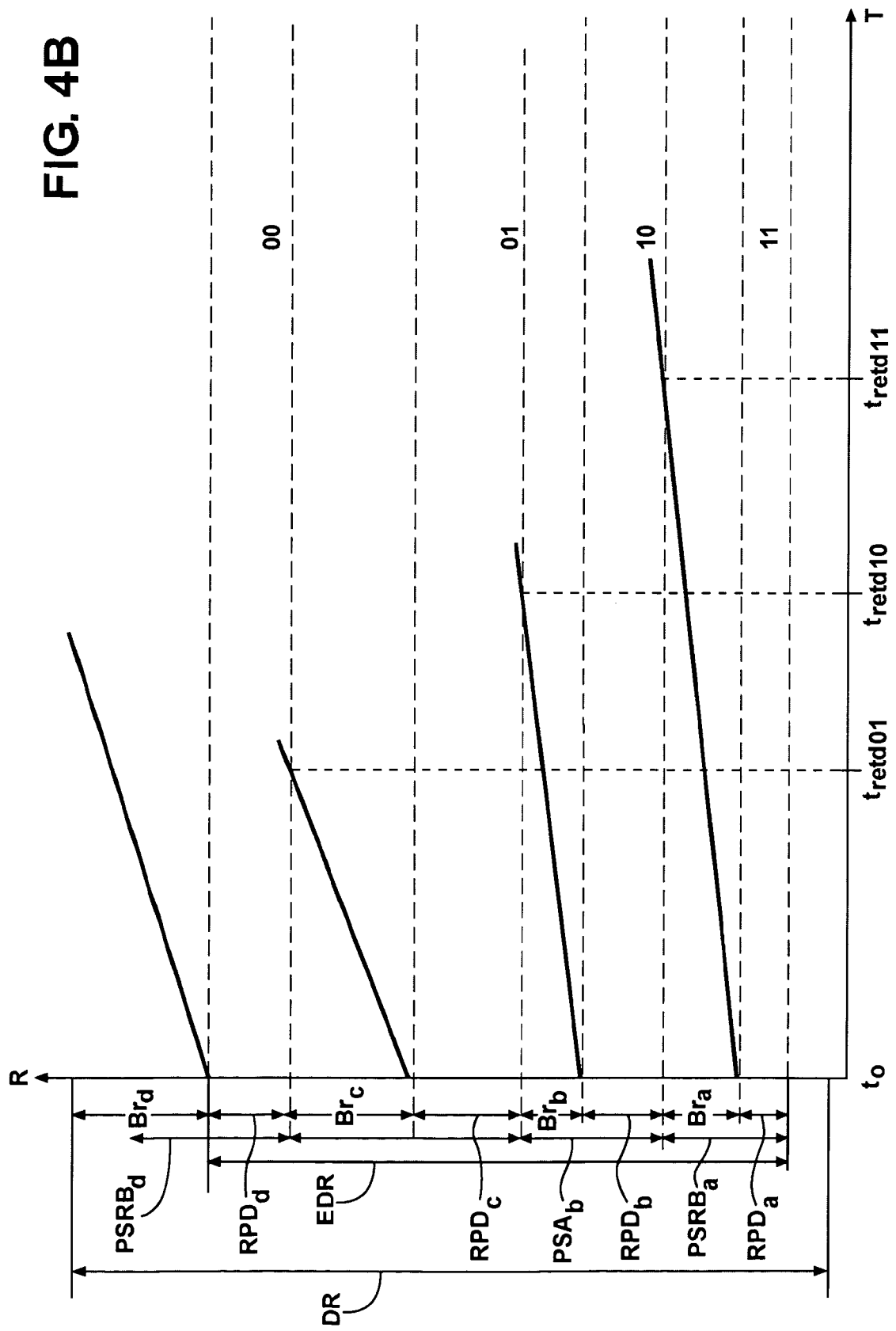
FIG. 4B is a storage level plot of a memory in accordance with the principles of the present invention.

The difference between a device's lowest and highest programmable resistance values will be referred to herein as the device's dynamic range, labeled DR in FIG. 4B. By programmable resistance values we mean the values to which the device may be programmed, not including drift or other post-programming factors. The difference between the upper bound of the lowest resistance range (that is, highest resistance within the SET resistance band) and the lower bound of the highest resistance range (that is, lowest resistance within the RESET resistance band) will be referred to herein as the device's effective dynamic range, labeled EDR in FIG. 4B. In this illustrative embodiment, resistance probability distributions RPDa, RPDb, RPDc, and RPDd occupy the lower portion of each respective program state resistance band PSRBa, PSRBb, PSRBc, PSRBd. In this illustrative embodiment, each program state resistance band includes a range of resistance values, referred to herein as a buffer region (respectively, Bra, Brb, Brc, and Brd), between the uppermost value of its resistance probability distribution and the lowest value of the resistance probability distribution for the next-higher program state. This range of resistances is set aside to allow for the upward drift of a memory's resistance over time. Setting aside such buffer resistance regions averts drift-induced read errors.

Resistance drift is particularly problematic in multi-state programming embodiments. Programming methods have been developed that produce a relatively tight distribution of programmed resistances. Bedeschi et al disclose a programming method for multi-level programming (also referred to as multi-level-cell, or "MLC" programming) in "A Multi-Level-Cell Bipolar-Selected Phase-Change Memory," presented at the 2008 IEEE International Solid-State Circuits Conference; T. Nirschl et al disclose an MLC programming method in "Write Strategies for 2 and 4-bit Multi-Level Phase-Change Memory" 2007 IEEE, both of which are hereby incorporated by reference. As previously indicated, a programmable resistance memory in accordance with the principles of the present invention may employ such techniques. Although tight storage level distributions can increase the buffer region between storage levels (for example, Bra, Brb, etc.), drift can, over time, reduce or eliminate that margin, potentially leading to the misinterpretation of programmed states.

A memory's effective dynamic range EDR need not be contiguous throughout the memory's resistance space. It may, for example, be particularly difficult to accurately program a memory to resistances within one or more regions of the memory's resistance space. Such regions may, therefore, be avoided in the assignment of program states, effectively placing gaps in the memory's effective dynamic range. Such EDR gaps may be incorporated into buffer regions between storage levels, such as the previously described buffer regions Bra, etc., for example.

If a plurality of memory cells were programmed to each of the four illustrative storage levels, the programmed resistances would form a probability distribution within each programming band at time $t_0$, with all of the programmed values fully encompassed by the respective resistance probability distributions. Over time, the resistance values tend to drift upward in a manner that may be characterized by a power law, $R=R_0(t/t_0)^d$, where: $R_0$ is the resistance at the time $t_0$ after programming, and d is the drift coefficient. The drift coefficient d tends to increase with higher programming resistance values, so that devices programmed to the highest resistance, corresponding to storage level 00, will tend to drift more during a given time span than devices programmed to the lowest resistance, corresponding to storage level 11. This, however, is merely a tendency and not uniformly the case.

Assuming that other factors, such as high temperatures that may tend to disturb certain stored states, are well-controlled, drift may dictate the effective retention period of a phase change memory. Over time, the resistance of one or more memory cells programmed within one resistance probability distribution band may drift upward in resistance sufficiently to impinge upon the next-higher resistance probability distribution band. The resistance of only one memory element need drift into a higher resistance probability distribution band to corrupt the storage scheme, as illustrated in FIG. 4B, by the upward drift of the resistance of memory elements programmed to the 11, 10, and 01 states into the resistance probability distributions of the respective next-higher storage states.

The time span between programming the memory cells, until the resistance of a cell drifts into the next-higher resistance distribution, at $t=t_{retd11}$, $t_{retd10}$, or $t_{retd01}$ determines the drift-related retention period of a memory array for a given storage level. The minimal such time, $t_{retdmin}$, sets the limit for drift-related data retention in such a memory. In this illustrative embodiment, $t_{retdmin}=t_{retd01}$. In accordance with the principles of the present invention, resistance distribution ranges may be assigned throughout the memory's effective dynamic range EDR in a manner intended to maximize the memory's drift-dependent retention time $t_{retdmin}$. Such maximization may be coordinated with other storage-level assignment processes in accordance with the principles of the present invention. Given a target data retention period (for example, 10 years, storage levels may be assigned in such a way as to ensure that the drift buffer associated with the worst-case drift coefficient accommodates the target data retention period.

The separation between assigned storage level ranges and drift-adjusted ranges diminishes over time and this is particularly true for storage levels associated with the top resistances within a memory's effective dynamic range. Even if the resistances of memory elements programmed to the highest resistance state drift upwardly at a greater rate than the memory elements programmed to the second-highest resistance state, thereby widening the gap between resistance-drifted memory elements of the two ranges over time, the gap between the programmed (pre drift) lower bound of the uppermost range and the drifted resistance of memory elements within the second highest range narrows with time. The increased gap between drifted elements provides no benefit in sensing the programmed state of a memory; it's the separation between the drifted resistance of the lower program state and the lower boundary of the programmed (pre drift) upper range that matters. Accordingly, resistance ranges associated with storage levels may be assigned to accommodate the drift in resistance from the nominal upper boundary of one resistance probability distribution to the lower boundary of the next-higher resistance probability distribution as programmed (prior to drift). In such embodiments it is assumed that the drift in resistance is not tracked and wholly compensated for by "subtracting out" the drift, for example. A memory may employ known drift coefficients and a predetermined target array retention time, for example, $t_{retdmin}$, to establish the bounds of the various resistance probability distributions associated with the memory's program states.

As will be described in greater detail in the discussion related to FIG. 7, a memory in accordance with the principles of the present invention may be configured to operate with a pre-set number of storage levels or, given information regarding drift coefficients and required data retention, the memory may be configured to assign storage level locations according to the number of storage levels it may safely employ. Both approaches will be discussed in greater detail below.

In an embodiment in which the number of storage levels and drift retention period are predetermined, the memory may have storage levels assigned in any of a variety of ways. More precisely, the nominal resistance values corresponding to storage levels, which reflect the resistance probability distributions for the memory cells in an array, may be assigned in a variety of ways in accordance with the principles of the present invention. Such assignment of storage levels may be performed during manufacturing, prior to shipping, or even once the memory is "in the field." Additionally, the assignment of these values may be carried out for all memories of a specific design (that is, all those using a specific phase change material, structure, and production process), for all memories in a given run of devices, on a lot-by-lot basis, or even on a device-by-device basis.

Optimization of level-assignment may employ simulations or test results performed at any stage, including during manufacturing, during pre-shipment testing, or in the field. Such testing may include self-testing performed by the memory, with the results of such testing employed to adjust: nominal storage levels, write and sense circuitry, and write and sense algorithms.

With the number of storage levels and drift period predetermined, the nominal storage values may be assigned to give the greatest margin to the most drift-susceptible region of the memory's resistance-space. In the example of a memory in which the drift-coefficient increases monotonically, the most drift-susceptible region would be the region between the second-highest and highest resistance values and, in such an embodiment, that region would be assigned the greatest margin. That is, although the region above the highest nominal resistance level is subject to more drift than the next lower level, it is, largely, a "don't care" region; no matter how far the memory's resistance drifts above this value, it will still be recognizable as the highest-level resistance.

In another illustrative embodiment, a memory in accordance with the principles of the present invention may assign storage levels in a manner that provides for equal periods of drift among the various storage levels. In the example of FIG. 4B this would mean that $t_{retd11}=t_{retd10}=t_{retd01}=t_{retd00}=t_{retdmin}$. Assigning equal periods of drift, that is, assigning storage levels so that the resistances of memories programmed to each of the storage levels drift upward and impinge upon the lower bound of the next-higher storage level at the same time, maximizes the drift-related retention period of a memory in accordance with the principles of the present invention. That is, in such an embodiment, because the drift-related retention period is the same for all programmed levels, the memory is not limited by a "worst case" drift-related retention period associated with any one of the programmed levels. Such a storage-level-assignment process may be an iterative process, for example, with the memory given preliminary level-assignments which may be adjusted until all levels converge on substantially the same drift-related retention period.

If, for example, a region of a memory's resistance-space is particularly problematic, if that region of the resistance space is particularly difficult to program with precision, or if the memory's drift coefficient in that region is somewhat variable, for example, a memory may assign lesser drift periods (that is, less separation between storage levels) to other storage levels and a larger drift period to the storage level associated with the problematic resistance region. In accordance with the principles of the present invention, storage levels may be distributed substantially linearly (e.g., 10 kΩ, 3.3 MΩ, and 9.9 MΩ nominal values for a 10 MΩ programming range), exponentially (e.g., 10 kΩ, 100 kΩ, 1 MΩ, 10 MΩ nominal values for the same 10 MΩ programming range), or other distribution means throughout the memory's dynamic range. Whether employing a substantially linear, a substantially exponential distribution scheme, or another distribution scheme, a programmable resistance memory in accordance with the principles of the present invention may have storage levels distributed regularly (as in the above example examples) or irregularly (to avoid a problematic resistance region, for example).

A programmable resistance memory in accordance with the principles of the present invention may also employ known drift reduction techniques, in combination with those set forth herein. Such techniques are described, for example, in U.S. Pat. No. 6,914,801 issued to Kostylev et al, and U.S. Pat. No. 7,391,642 issued to Gordon et al, which are hereby incorporated by reference. As will be described in greater detail in the discussion related to FIG. 5, a programmable resistance memory in accordance with the principles of the present invention may employ programmable resistance memory material and associated components that provide a high dynamic/drift ratio. Such a memory may be capable of meeting retention specifications without resorting to drift-compensation techniques or better retention with the combined use of drift-compensation techniques. Various methods of assigning storage levels for high dynamic/drift ratio memories are contemplated within the scope of the invention. Those methods include, but are not limited to: substantially-even linear, substantially-even exponential, equal drift-period, and specific-range-maximized drift-period methods. The drift coefficients and effective dynamic range employed in accordance with the principles of the present invention may be determined through simulation and/or testing of devices. Testing may take place during the manufacturing process, pre-shipping, or in the field, during a self-test, for example.

Figure 5:
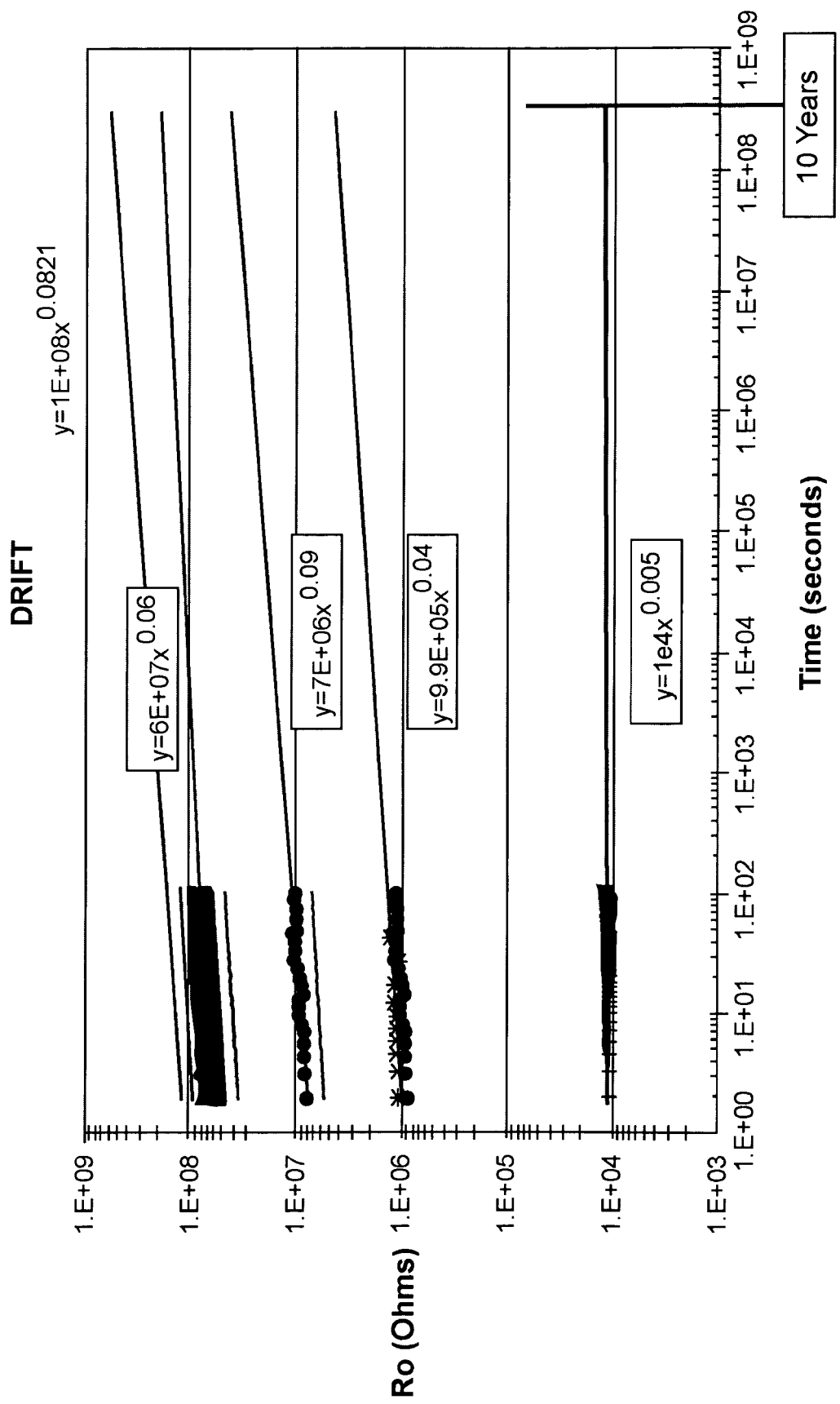
FIG. 5 is a storage level plot of a memory in accordance with the principles of the present invention that illustrates resistance drift.

The log/log, resistance versus time plot of FIG. 5 illustrates the characteristics of a high dynamic/drift ratio memory in accordance with the principles of the present invention. In this illustrative embodiment the dynamic range of the memory's phase change material is approximately 800 M.OMEGA.: from approximately 10 kΩ to 800 MΩ. As indicated by the projected resistance values, such a memory could accommodate four storage levels, with nominal values of 10 kΩ, 1 MΩ, 8 MΩ, and 80 MΩ, for a period of ten years without concern for drift. In this illustrative embodiment, the gap between the lowest and next-lowest nominal storage levels (at 10 kΩ and 1 MΩ) would seem capable of accommodating another storage level, with a separation conforming to the substantially exponential separation of the other storage levels. In this illustrative embodiment, however, it is difficult to program the device with requisite precision to resistance values that lie within that range. Such difficulty may arise, for example, from a sharp transition between resistance values (e.g., a small increase in programming current yields a larger increase in resistance change), as evidenced by a steeply-sloped region in an R–I curve, such as the I/R curve of FIG. 4A. Accordingly, nominal resistance values were chosen from regions within the device's dynamic range that were more-readily programmed. Those regions, in combination, constitute the device's effective dynamic range and, in accordance with the principles of the present invention, storage levels are distributed within that effective dynamic range. As it happens, the drift coefficient associated with the lowest storage level is negligible and, were the device amenable to accurate programming in that region, the device might have been capable of accommodating a plurality of additional storage levels without drift-related limitation.

As previously indicated, storage levels may be distributed throughout a memory's dynamic range in a manner that is substantially exponential, as in most of the distributions of FIG. 5, substantially linear, or other distribution means that, for example, contemplates the difficulty of accurately programming the device in a certain resistance region.

Figure 6:
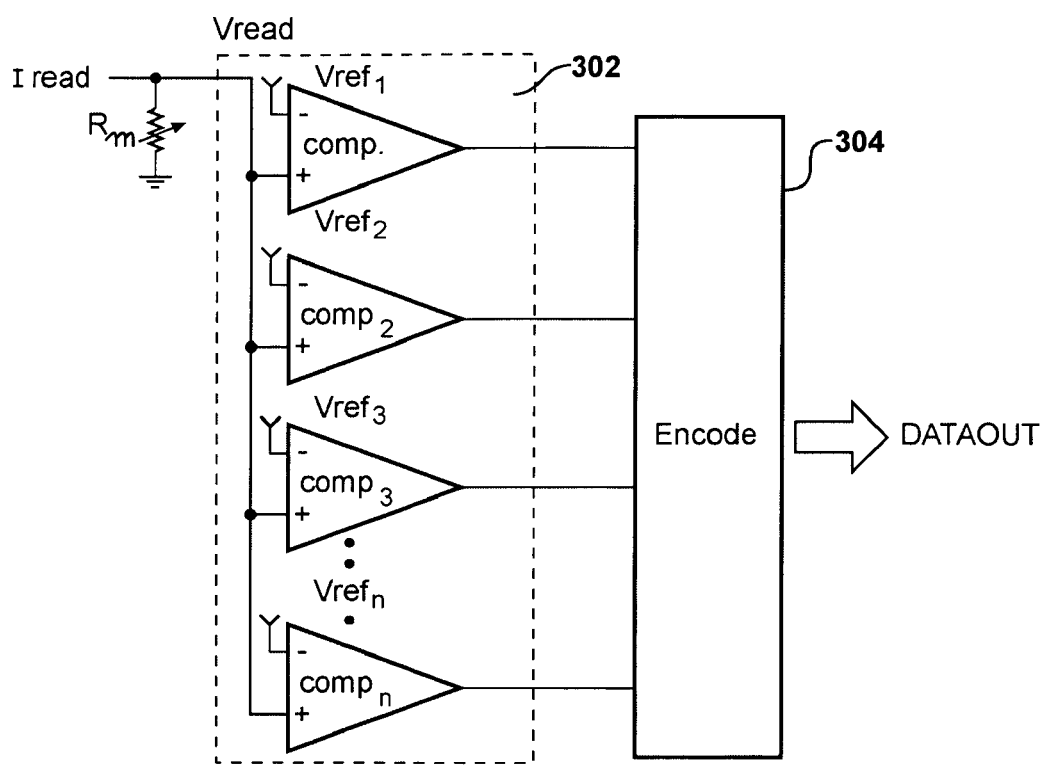
FIG. 6 is a block diagram of a sense circuit in accordance with the principles of the present invention.

The conceptual block diagram of FIG. 6 provides a more-detailed view of the sense 302 and encode 304 blocks described in the discussion related to FIG. 3. Selection and isolation circuitry have been eliminated from this view in order to simplify explanation. For clarity of explanation, this example also simplifies storage schemes, eliminating the use of "buffer regions" between nominal resistance values. In this illustrative embodiment, a selected memory cell is modeled as a variable resistance Rm configured to receive a read current Iread and to develop a read voltage Vread in response. The read current Iread is provided by access control circuitry 300 described in the discussion related to FIG. 3. The memory cell is connected in parallel to the non-inverting inputs of a plurality of comparators, Comp1, Comp2, Comp3 . . . Compn. The inverting inputs of the comparators are respectively connected to reference voltage source Vref1, Vref2, Vref3 . . . , Vrefn.

With a fixed read current, the reference voltages are selected to correspond to the various resistance levels of the memory's storage scheme. In an embodiment in which three storage levels are represented by resistances of 2 kΩ, 4 kΩ, and 6 kΩ, and a single, fixed, read current of 100 µA is employed to read the state of the memory, the reference voltages may be set to 0.2V, 0.4V, and 0.6V, for example. Similarly, in an embodiment in which three storage levels are represented by resistances of 10 kΩ, 30 kΩ, and 200 kΩ, and a single, fixed, read current of 5 µA is employed, the corresponding reference voltage levels may be set at 50 mV, 250 mV, and 1V, respectively. The advantage of a parallel arrangement of comparators such as this, is speed; a single read current value applied to the memory cell elicits a response from the appropriate comparator(s) instantaneously. However, as indicated by the increasingly broad range of reference voltages, as the dynamic range of the memory increases, the range of reference voltages must also be increased, and satisfying that requirement becomes increasingly problematic with increasing dynamic range.

As indicated in the discussion related to FIG. 5, in some high dynamic-range to drift-coefficient embodiments in accordance with the principles of the present invention, the memory exhibits a very high dynamic range (substantially equal to 1 GΩ, for example). Using a single, fixed read current of 20 nA, with storage levels of 10 kΩ, 1 MΩ, 8 MΩ, and 80 MΩ, would require reference voltages of 200 µV, 20 mV, 160 mV, and 1.6V, for example. Rather than employing such a wide range of precision voltage references (and comparators), a sensing circuit in accordance with the principles of the present invention may employ a plurality of precision current sources and apply them to a selected memory in a sequence of increasing magnitude. For example, with a single comparator (e.g., COMP1) having its non-inverting input coupled to the memory, and a single 0.5V reference voltage Vref1 coupled to the inverting input of comparator COMP1, the read current source could step up through the sequence 6 nA, 60 nA, 500 nA and 50 μA, corresponding respectively to the 10 kΩ, 1 MΩ, 8 MΩ, and 80 MΩ storage levels, until the comparator is triggered. As previously indicated, the number of current sources applied to the memory cell may be counted and the number/count required to trigger the comparator may be used to encode the data represented by the resistance of the cell.

Figure 7:
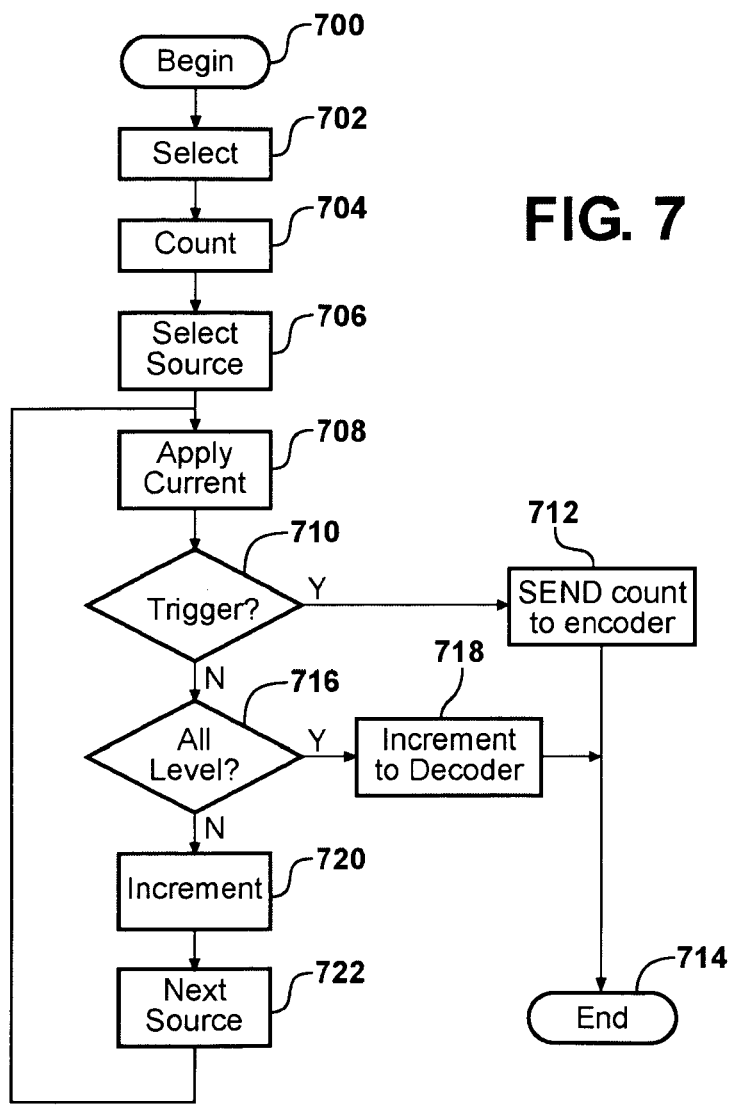
FIG. 7 is a flow chart illustrating a programming method in accordance with the principles of the present invention.

The flow chart of FIG. 7 depicts an illustrative embodiment of the process of reading a programmable resistance memory using multiple precision current sources. Depending upon the organization of the memory array, multiple cells may be selected simultaneously, for nibble-, byte-, word-, etc. wide access to the array. The process outlined here deals with access to an individual memory cell, extension to multi-cell access processes should be apparent to one skilled in the art and are contemplated within the scope of the invention. As previously indicated, the process outlined here may be used in combination with other known methods of reading programmable resistance memories, some of which methods have been incorporated by reference above. In this illustrative embodiment, each programming level is assigned an individual precision current source; embodiments that dedicate less than one or more than one current source to each programming level are contemplated within the scope of the invention.

The process begins in step 700 and proceeds from there to step 702 where a memory cell within an array is selected, using address decoding circuitry, for example. From step 702 the process proceeds to step 704, where the sequence of applying a series of increasing-magnitude read currents from a plurality of precision-current sources to the selected memory cell begins. In step 704 a counter that tracks the number of current sources that have been sequentially applied to the selected memory cell is initialized. From step 704 the process proceeds to step 706, where the lowest-amplitude of the precision current sources is selected for application to the selected memory cell. From step 706 the process proceeds to step 708 where the selected precision current source is applied to the selected memory cell. From step 708 the process proceeds to step 710 where a read comparator, such as described in the discussion related to FIG. 6, is monitored to determine whether it "triggers." If the comparator triggers, the memory cell is programmed to a level corresponding to the read current. That is, by applying the read currents in order from lowest to highest, and terminating the process once the comparator triggers, the process ensures that the comparator only triggers when the applied read current corresponds to the programmed level of the accessed memory. Consequently, if, in step 710 the comparator is determined to have triggered, the process proceeds to step 712, where the count, initialized in step 704 and corresponding to the precision current source that has been applied to the selected memory, is transferred to an encoder. The encoder then encodes the count into an appropriate representation (e.g., binary, binary-coded decimal, etc.) for presentation to the memory's data output lines. From step 712 the process proceeds to end in step 714.

Returning to step 710, if the comparator does not trigger during a predetermined period, the process proceeds from step 710 to step 716. In step 716, the count, initialized in step 704, is examined to determine whether the selected memory cell has been tested for all-but-one storage levels. If the memory cell has been tested for all-but-one storage levels without triggering the comparator, that indicates, in this illustrative embodiment, that the cell is programmed to the lowest-resistance storage level and the process proceeds to step 718 where the count is incremented by one and passed to the encoder for encoding, as previously described. From step 718 the process moves to end in step 714.

Returning to step 716, if the memory cell has been tested for less than all-but-one of the storage levels, the process proceeds to step 720, where the count is incremented, and from there, to step 722, where the next-higher amplitude read current is selected for application to the memory cell. From step 722, the process returns to step 708 and proceeds from there as previously described. In an illustrative embodiment, the sequencing circuitry is implemented in hardware and the entire sequence may be executed within a standard access period. That is, because a write operation may generally require more time than a read operation, the memory's access cycle time may be dictated by the time required to write to the memory. By implementing the sequencing circuitry in hardware (as opposed, for example, to implementing it in controller), the sequence may be carried out quickly enough that the read operation doesn't dictate the access cycle time.

Our testing of phase-change alloys indicates that, although drift coefficients tend to increase somewhat with alloys that exhibit increased dynamic range, drift coefficients increase at a slower rate than the dynamic range increases. Consequently, phase change memories that employ high dynamic range alloys may provide longer periods of "drift-consequences-free" operation (also referred to herein, more conveniently, as "drift-free" operation). That is, using high dynamic range phase change alloys in accordance with the principles of the present invention, allows a memory to operate for a longer period of time without resistance drift creating ambiguity in the memory's programmed states. We investigated the suitability of a variety of alloys for use in programmable resistance memories that exhibit high ratios of dynamic range to drift coefficient and found that alloys of indium/antimony/tellurium (IST) yield very high dynamic range devices. Additionally selenium-doped and arsenic-doped germanium/antimony/tellurium (GST) alloys yield high dynamic range devices similarly suitable for high ratio of dynamic range-to-drift coefficient operation.

Figure 8:
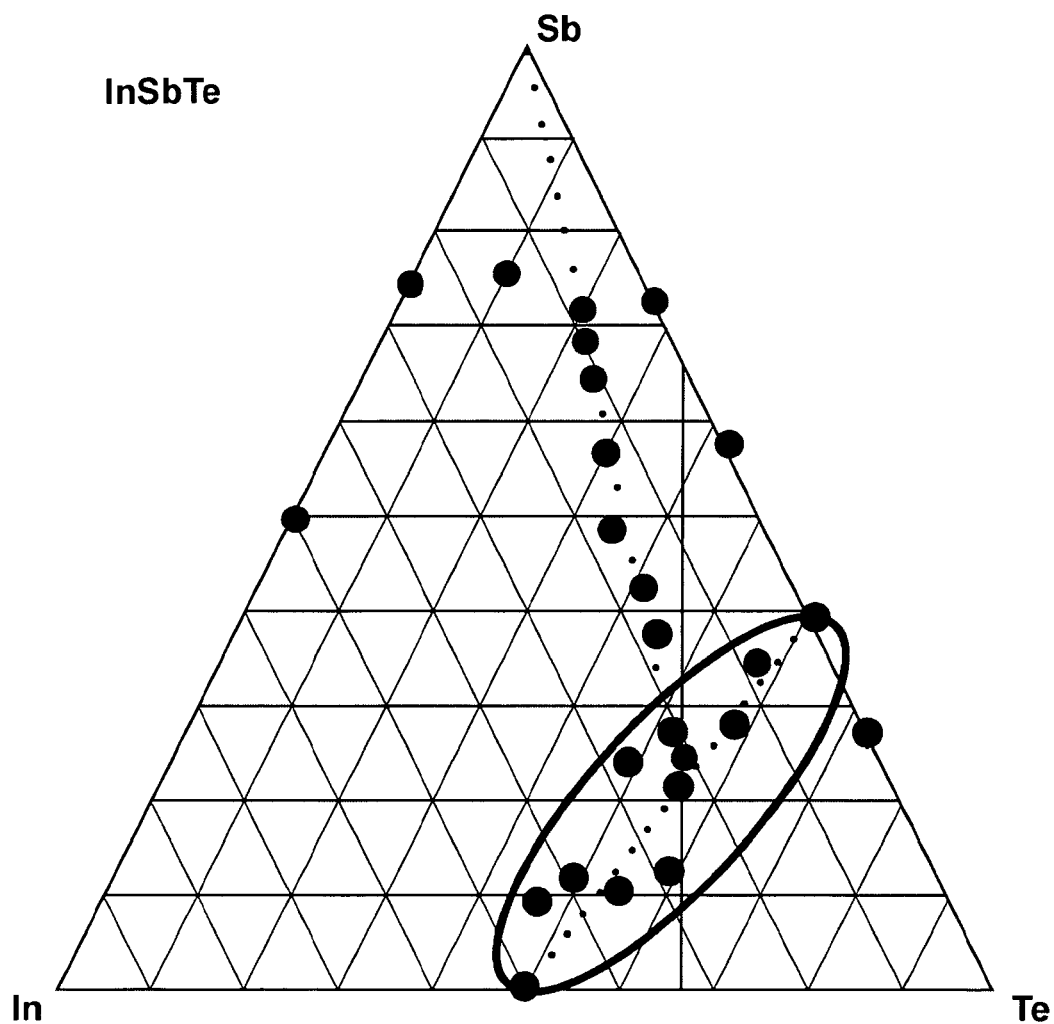
FIG. 8 is a ternary plot illustrating a range of IST alloy compositions such as may be employed by a memory in accordance with the principles of the present invention.

The ternary IST diagram of FIG. 8 illustrates a range of alloys along the pseudo-binary tie line (within the circle) that might be particularly suitable for use in high dynamic range to drift coefficient ratio phase change memory devices. The percent by atomic weight of the three constituent elements (IST) varies from 8% to 50%, from 5% to 40%, and from 40% to 60%, respectively, for indium, antimony and tellurium. Increasing the relative amount of indium will tend to increase the dynamic range of the resulting device, which is desirable for high ratio of dynamic-range to drift-coefficient operation. However, the threshold voltage of the device will also increase, which may lead to a deterioration of the device's endurance characteristics. As a result, a phase change memory device in accordance with the principles of the present invention is configured to balance the requirements for endurance against those for drift-free operation.

Figure 9:
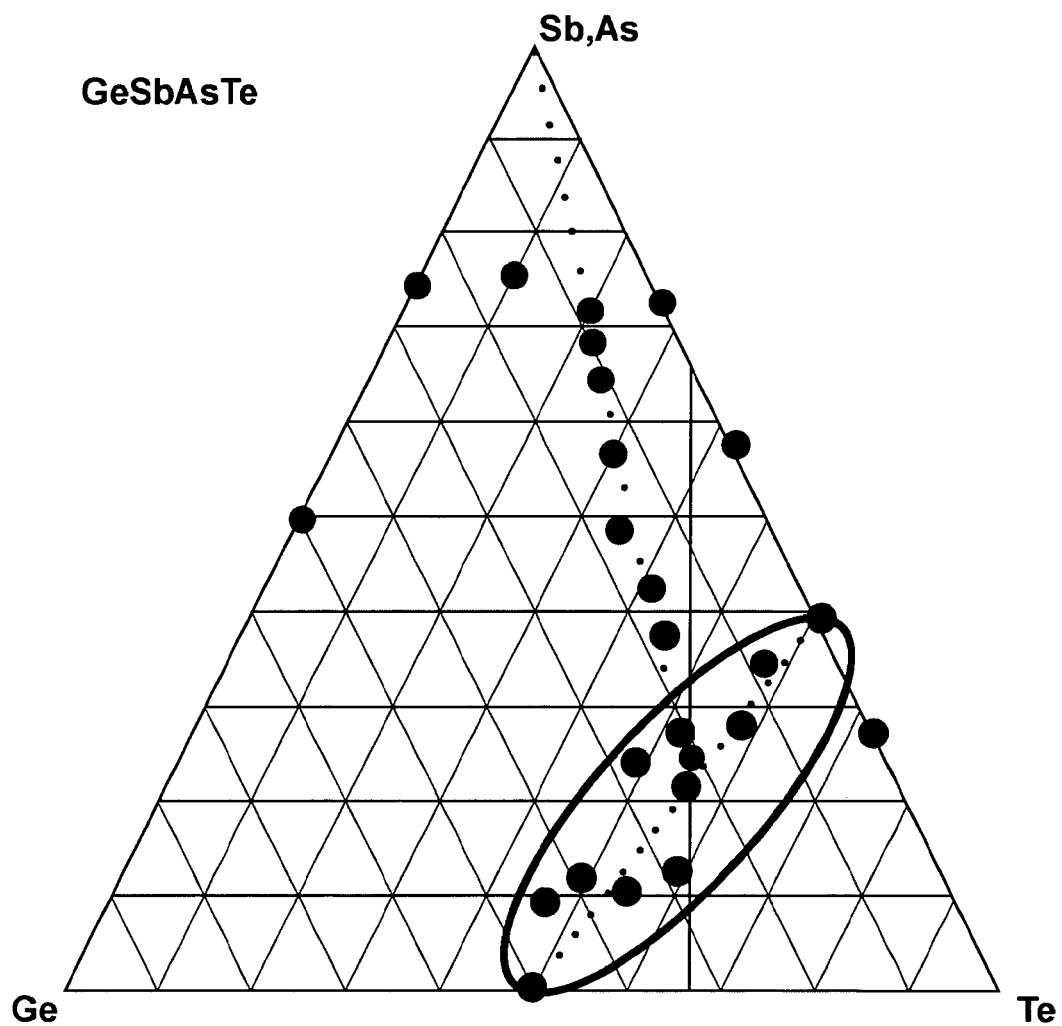
FIG. 9 is a quaternary plot illustrating a range of As-doped GST alloy compositions such as may be employed by a memory in accordance with the principles of the present invention.

Similarly, the quaternary As-doped GST diagram of FIG. 9 illustrates a range of alloys along the pseudo-binary tie line (within the circle) that might be particularly suitable for use in high ratio of dynamic range to drift coefficient phase change memory devices. The percent by atomic weight of the four constituent elements (AsGeSbTe) varies from 3% to 20%, from 8% to 50%, from 5% to 40%, and from 40% to 60%, respectively for arsenic, germanium, antimony, and tellurium. Increasing the relative amount of arsenic will tend to increase the dynamic range of the resulting device, but will also tend to increase threshold voltage of the device. The increase in threshold voltage may lead to a deterioration of the device's endurance characteristics and, as a result, a phase change memory device in accordance with the principles of the present invention employing such alloys is configured to balance the requirements for endurance against those for drift-free operation by adjusting the levels of arsenic contained within the alloy.

Figure 10:
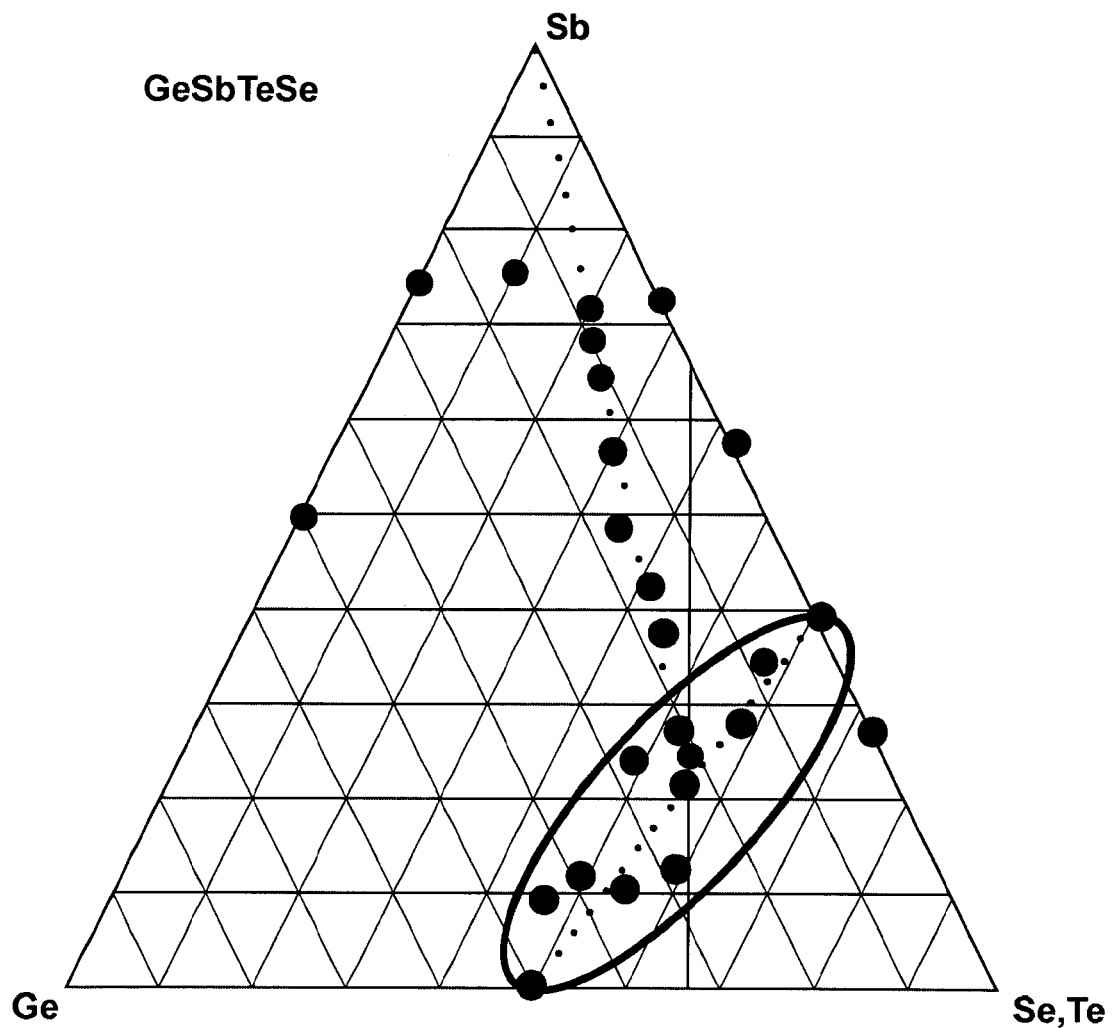
FIG. 10 is a quaternary plot illustrating a range of Se-doped GST alloy compositions such as may be employed by a memory in accordance with the principles of the present invention.

Finally, the quaternary Se-doped GST diagram of FIG. 10 illustrates a range of alloys along the pseudo-binary tie line (within the circle) that might be particularly suitable for use in high ratio of dynamic range to drift coefficient phase change memory devices. The percent by atomic weight of the four constituent elements (SeGeSbTe) varies from 5% to 20%, from 8% to 50%, from 5% to 40%, and from 35% to 55%, respectively for selenium, germanium, antimony, and tellurium. In this illustrative embodiment, increasing the percentage of selenium will tend to increase both the dynamic range and the threshold voltage of the resulting device. And, as a result, a phase change memory device employing such alloys in accordance with the principles of the present invention is configured to balance the requirements for endurance against those for drift-free operation by adjusting the levels of Selenium contained within the alloy.

Figure 11:
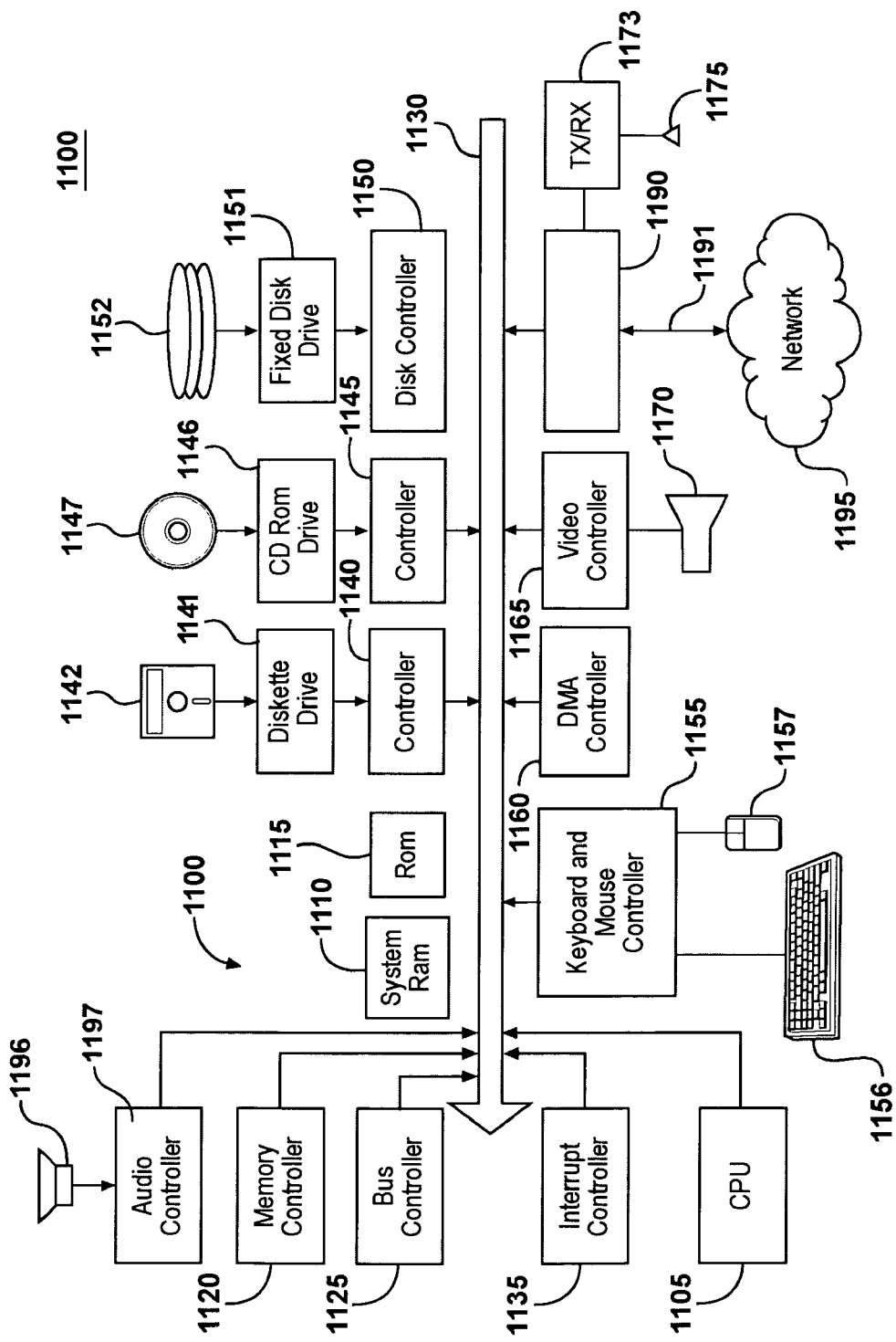
FIG. 11 is a conceptual block diagram of an electronic system such as may employ programmable resistance memories in accordance with the principles of the present invention.

The electronic device(s) described in the discussion related to the previous figures may be employed to particular advantage in a wide variety of systems. The schematic diagram of FIG. 11 will be discussed to illustrate the devices' use in a few such systems. The schematic diagram of FIG. 11 includes many components and devices, some of which may be used for specific embodiments of a system in accordance with the principles of the present invention and others not used. In other embodiments, other similar systems, components and devices may be employed. In general, the system includes logic circuitry configured to operate along with high ratio of dynamic range to drift coefficient phase change memory devices in accordance with the principles of the present invention. The logic circuitry may be discrete, programmable, application-specific, or in the form of a microprocessor, microcontroller, or digital signal processor, for example. The embodiments herein may be employed on integrated chips or connected to such circuitry. The exemplary system of FIG. 11 is for descriptive purposes only. Although the description may refer to terms commonly used in describing particular computer, communications, tracking, and entertainment systems; the description and concepts equally apply to other systems, including systems having architectures dissimilar to that illustrated in FIG. 11. The electronic system 1100, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 11 may employ high ratio of dynamic range to drift coefficient phase change memory devices, for example.

In an illustrative embodiment, the system 1100 may include a central processing unit (CPU) 1105, which may be implemented with some or all of a microprocessor, a random access memory (RAM) 1110 for temporary storage of information, and a read only memory (ROM) 1115 for permanent storage of information. A memory controller 1120 is provided for controlling RAM 1110. In accordance with the principles of the present invention, all of, or any portion of, any of the memory elements (e.g. RAM or ROM) may be implemented with high ratio of dynamic range to drift coefficient phase change memory devices.

An electronic system 1100 in accordance with the principles of the present invention may be a microprocessor that operates as a CPU 1105, in combination with embedded high ratio of dynamic range to drift coefficient phase change memory devices that operates as RAM 1110 and/or ROM 1115, or as a portion thereof. In this illustrative example, the microprocessor/high ratio of dynamic range to drift coefficient phase change memory devices combination may be standalone, or may operate with other components, such as those of FIG. 11 yet-to-be described.

In implementations within the scope of the invention, a bus 1130 interconnects the components of the system 1100. A bus controller 1125 is provided for controlling bus 1130. An interrupt controller 1135 may or may not be used for receiving and processing various interrupt signals from the system components. Such components as the bus 1130, bus controller 1125, and interrupt controller 1135 may be employed in a large-scale implementation of a system in accordance with the principles of the present invention, such as that of a standalone computer, a router, a portable computer, or a data storage system, for example.

Mass storage may be provided by diskette 1142, CD ROM 1147, or hard drive 1152. Data and software may be exchanged with the system 1100 via removable media such as diskette 1142 and CD ROM 1147. Diskette 1142 is insertable into diskette drive 1141 which is, in turn, connected to bus 1130 by a controller 1140. Similarly, CD ROM 1147 is insertable into CD ROM drive 1146 which is, in turn, connected to bus 1130 by controller 1145. Hard disc 1152 is part of a fixed disc drive 1151 which is connected to bus 1130 by controller 1150. Although conventional terms for storage devices (e.g., diskette) are being employed in this description of a system in accordance with the principles of the present invention, any or all of the storage devices may be implemented using high ratio of dynamic range to drift coefficient phase change memory devices in accordance with the principles of the present invention. Removable storage may be provided by a nonvolatile storage component, such as a thumb drive, that employs high ratio of dynamic range to drift coefficient phase change memory devices in accordance with the principles of the present invention as the storage medium. Storage systems that employ high ratio of dynamic range to drift coefficient phase change memory devices as "plug and play" substitutes for conventional removable memory, such as disks or CD ROMs or thumb drives, for example, may emulate existing controllers to provide a transparent interface for controllers such as controllers 1140, 1145, and 1150, for example.

User input to the system 1100 may be provided by any of a number of devices. For example, a keyboard 1156 and mouse 1157 are connected to bus 1130 by controller 1155. An audio transducer 1196, which may act as both a microphone and/or a speaker, is connected to bus 1130 by audio controller 1197, as illustrated. Other input devices, such as a pen and/or tabloid may be connected to bus 1130 and an appropriate controller and software, as required, for use as input devices. DMA controller 1160 is provided for performing direct memory access to RAM 1110, which, as previously described, may be implemented in whole or part using high ratio of dynamic range to drift coefficient phase change memory devices in accordance with the principles of the present invention. A visual display is generated by video controller 1165 which controls display 1170. The display 1170 may be of any size or technology appropriate for a given application.

In a cellular telephone or portable entertainment system embodiment, for example, the display 1170 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 1100 may also include a communications adaptor 1190 which allows the system to be interconnected to a local area network (LAN) or a wide area network (WAN), schematically illustrated by bus 1191 and network 1195. An input interface 1199 (not shown) operates in conjunction with an input device 1193 (not shown) to permit a user to send information, whether command and control, data, or other types of information, to the system 1100. The input device and interface may be any of a number of common interface devices, such as a joystick, a touch-pad, a touch-screen, a speech-recognition device, or other known input device. In some embodiments of a system in accordance with the principles of the present invention, the adapter 1190 may operate with transceiver 1173 and antenna 1175 to provide wireless communications, for example, in cellular telephone, RFID, and wifi computer implementations.

Operation of system 1100 is generally controlled and coordinated by operating system software. The operating system controls allocation of system resources and performs tasks such as processing scheduling, memory management, networking, and I/O services, among other things. In particular, an operating system resident in system memory and running on CPU 1105 coordinates the operation of the other elements of the system 1100.

In illustrative handheld electronic device embodiments of a system 1100 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 1155, keyboard 1156 and mouse 1157, for example. Embodiments with a transmitter, recording capability, etc., may also include a microphone input (not shown).

In an illustrative RFID transponder implementation of a system 1100 in accordance with the principles of the present invention, the antenna 1175 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 1173. where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a high ratio of dynamic range to drift coefficient phase change memory devices in accordance with the principles of the present invention. In this illustrative embodiment, data read out from the memory is transferred to the transceiver 1173 as an "answerback" signal on the antenna 1175 at a second carrier frequency $F_2$. In passive RFID systems, power is derived from the interrogating signal and memory such as provided by a high ratio of dynamic range to drift coefficient phase change memory devices in accordance with the principles of the present invention is particularly well suited to such use.

We claim:

1. A method of operating a programmable resistance memory comprising:
   providing a programmable resistance memory;
   defining an operable resistance range for said memory, said resistance range extending from a minimum resistance to a maximum resistance;
   specifying a first resistance for a first memory state;
   specifying a second resistance for a second memory state, said second resistance exceeding said first resistance, said memory drifting from said first resistance to said second resistance in a first interval of time;
   programming said memory to said first memory state at a first time;
   reading said memory at a second time, said second time being later than said first time by less than said first interval of time;
   specifying a third resistance for a third memory state, said third resistance exceeding said second resistance;
   programming said memory to said second memory state at a third time, said second resistance drifting to said third resistance in a second interval of time; and
   reading said memory at a fourth time, said fourth time being later than said third time by less than said second interval of time.

2. The method of claim 1, wherein said programmable resistance memory comprises a phase-change material.

3. The method of claim 1, wherein said first resistance is greater than said minimum resistance.

4. The method of claim 1, wherein said second resistance is less than said maximum resistance.

5. A method of operating a programmable resistance memory comprising:
   providing a programmable resistance memory;
   defining an operable resistance range for said memory, said resistance range extending from a minimum resistance to a maximum resistance;
   specifying a first resistance band for a first memory state, said first resistance band extending from a first lower resistance to a first upper resistance, said memory drifting from said first lower resistance to said first upper resistance in a first interval of time;
   programming said memory to said first memory state at a first time;
   reading said memory at a second time, said second time being later than said first time by less than said first interval of time;
   specifying a second resistance band for a second memory state, said second resistance band extending from a second lower resistance to a second upper resistance, said memory drifting from said second lower resistance to said second upper resistance in a second interval of time;
   programming said memory to said second memory state at a third time; and
   reading said memory at a fourth time, said fourth time being later than said third time by less than said second interval of time.

6. The method of claim 5, wherein said programmable resistance memory comprises a phase-change material.

7. The method of claim 5, wherein said first lower resistance is greater than said minimum resistance.

8. The method of claim 5, wherein said first upper resistance is less than said maximum resistance.

9. The method of claim 5, wherein said second lower resistance is greater than said first upper resistance.

10. The method of claim 5, wherein said second upper resistance is less than said maximum resistance.

* * * * *